(12) United States Patent
Kumagai et al.

(10) Patent No.: US 7,196,395 B2
(45) Date of Patent: Mar. 27, 2007

(54) SEMICONDUCTOR DEVICE AND MANUFACTURING METHOD

(75) Inventors: Yukihiro Kumagai, Chiyoda (JP);
Hideo Miura, Koshigaya (JP);
Hiroyuki Ohta, Tsuchiura (JP);
Michihiro Mishima, Kunitachi (JP);
Katsuyuki Nakanishi, Higashiyamato (JP)

(73) Assignee: Renesas Technology Corporation, Tokyo (JP)

( * ) Notice: Subject to any disclaimer, the term of this patent is extended or adjusted under 35 U.S.C. 154(b) by 1061 days.

(21) Appl. No.: 10/301,624

(22) Filed: Nov. 22, 2002

(65) Prior Publication Data
US 2003/0132473 A1 Jul. 17, 2003

(30) Foreign Application Priority Data
Nov. 26, 2001 (JP) .................................... 2001-358651

(51) Int. Cl.
*H01L 29/00* (2006.01)

(52) U.S. Cl. ........................................ 257/506; 257/523
(58) Field of Classification Search ................ 257/520, 257/523, 499
See application file for complete search history.

*Primary Examiner*—Fetsum Abraham
(74) *Attorney, Agent, or Firm*—Antonelli, Terry, Stout & Kraus, LLP

(57) ABSTRACT

The object is the present invention is to provide a semiconductor device including a circuit employing two or more field-effect transistor that are desired to have equal characteristics, capable of realizing high reliability and superior transistor characteristics. The transistors which are desired to have equal characteristics are placed in the semiconductor device so as to have the same STI trench width (the width of shallow trench isolation adjacent to an active in which the transistor is formed). By such composition, stress growing in the active due to the shallow trench isolation is equalized among the transistors and thereby the characteristics of the transistors can be equalized.

15 Claims, 11 Drawing Sheets

SEMICONDUCTOR DEVICE AND MANUFACTURING METHOD

BACKGROUND OF THE INVENTION

The present invention relates to a semiconductor device, and in particular, to a semiconductor device having an electric circuit in which two or more FETs (Field-Effect Transistors) are desired to have equal characteristics.

With the progress of information communication devices in recent years, research and development are being made for increasing the packing density and capacity of semiconductor devices such DRAM (Dynamic Random Access Memory). In the circuit layout design of DRAM etc., a necessary electric circuit is placed in an area allocated on a Si (silicon) substrate under certain design rules (dimensional restrictions such as minimum processing dimensions). Each element or component (FET etc.) of the electric circuit is electrically isolated from other elements by use of a structure called "shallow trench isolation" (STI), in which a shallow trench is formed on the Si substrate and the trench is filled with silicon oxide etc. for electrical insulation.

As methods for forming element isolation parts (fields) and actives, a method forming trenches and filling them with insulating material, a method forming thermally-oxidized films, etc. have been disclosed in JP-A-1-223741, JP-A-4-42948, JP-A-8-241922, JP-A-8-279553, etc.

In the conventional circuit layout design, however, electrical characteristics concerning the shallow trench isolation have been regarded as those for merely isolating and separating adjacent elements (FET etc.). Therefore, other characteristics such as the width of the trench have not been taken into consideration for the transistor characteristics. The trench width of the shallow trench isolation that is formed adjacent to an element (hereafter, also referred to as "STI trench width"), which is in many cases determined by surrounding circuit layout, used to vary depending on the case, and there used to be cases where two FETs that are desired to have equal characteristics had different STI trench widths.

In memory devices such as DRAM, information stored in each memory cell is read out by a sense amplifier circuit by detecting the change of voltage on a bit line. Since the voltage change on the bit line is extremely small, the sense amplifier circuit generally employs two transistors having equal characteristics to be capable of detecting the subtle voltage difference on the bit line. As mentioned above, the shallow trench isolation has been regarded merely as a means for isolating and separating each element such as FET, and as a result, two transistors that are desired to have equal characteristics in circuit layout of a sense amplifier circuit used to have different STI trench widths. However, even in such a circuit layout designing method, no characteristics difference occurred between the two transistors that are desired to have equal characteristics.

In DRAM whose storage capacity is increasing constantly, the miniaturization and high integration are being promoted in its sense amplifier circuit as well as in its memory section. In conventional circuit layout designing methods, the miniaturization of the sense amplifier circuit is basically carried out by simply scaling down the circuit layout of previous-generation sense amplifier circuit having larger processing dimensions, therefore, the difference in the STI trench width tended to be maintained. Meanwhile, by the micromachining technology of recent years, the STI trench width has become as narrow as approximately 0.2 μm at its narrowest part.

As explained above, the conventional circuit layout design for increasing the capacity and integration of a semiconductor device is conducted basically by scaling down the previous-generation circuit layout having larger processing dimensions. The shallow trench isolation in the conventional circuit layout is used for the purpose of simply isolating and separating the elements, and thus there are cases where the width of the shallow trench isolation adjacent to the FET varies among FETs that are required to have equal characteristics. Meanwhile, as a result of the device miniaturization of recent years, the narrowest part of the shallow trench isolation has become as narrow as approximately 0.2 μm and is expected to be still narrower in the future.

The present inventors found out that the conventional scaling down of circuit layout might cause characteristics difference between the FETs that are desired to have equal characteristics.

The shallow trench isolation, which is obtained by forming a shallow trench on a Si substrate and filling the trench with silicon oxide, is known as a source of stress. Specifically, the stress grows in active areas around the shallow trench isolation during an oxidation process after the formation of the shallow trench on the Si substrate. The present inventors made it clear by stress analysis that the stress growing in the active around the trench increases rapidly as the STI trench width gets narrower than 1 μm.

The shallow trench isolation, which is obtained by forming a shallow trench on a Si substrate and filling the trench with silicon oxide, is known as a source of stress. Specifically, the stress grows in active areas around the shallow trench isolation during an oxidation process after the formation of the shallow trench on the Si substrate. The present inventors made it clear by stress analysis that the stress growing in the active around the trench increases rapidly as the STI trench width gets narrower than 1 μm.

BRIEF SUMMARY OF THE INVENTION

It is therefore the primary object of the present invention to provide a high-performance semiconductor device capable of displaying its semiconductor characteristics fully and effectively.

As mentioned above, semiconductor devices such DRAM are having increasing packing density and capacity and thereby having miniaturized circuit layout. The present inventors made it clear that the stress on the active area caused by the shallow trench isolation adjacent to the transistor is becoming highly dependent on the trench width due to the above trend and there are cases where a circuit (sense amplifier circuit, differential amplifier circuit, etc.) having transistors that are required equal characteristics can not obtain the equal characteristics.

In order to provide a high-performance semiconductor device capable of displaying its semiconductor characteristics fully and effectively, the present invention can employ the following composition. Specifically, a semiconductor device including an electric circuit in which at least two or more FETs are desired to have equal characteristics is configured as below for example, in order to deal with the challenge.

(1) A first semiconductor device in accordance with the present invention comprises: a semiconductor substrate; a field area on the semiconductor substrate having a semiconductor insulating layer; a plurality of active areas surrounded by the field area; a first active area including a first FET and a second FET forming a circuit for outputting an output signal based on an input signal; a second active area adjacent to the first active area across a field area on the side of the first FET; a third active area adjacent to the first active area across a field area on the side of the second FET; a fourth active area; and a fifth active area adjacent to the fourth active area across a field area. In the semiconductor device, the distance between the first and second active areas and the distance between the first and third active areas are different from the distance between the fourth and fifth active areas, and the difference between the distance between the first and second active areas and that between the first and third active areas is set smaller than the difference between the distance between the first and second active areas and that between the fourth and fifth active areas.

Another semiconductor device comprises: a semiconductor substrate; a field area on the semiconductor substrate having a semiconductor insulating layer; a plurality of active areas adjacent to the field area; a first active area including a first FET and a second FET forming a circuit for receiving an input signal and outputting an output signal corresponding to the input signal; a second active area adjacent to the first active area across a field area on the side of the first FET; and a third active area adjacent to the first active area across a field area on the side of the second FET. In the semiconductor device, the distance between the first and second active areas is set equal within the extent of error to the distance between the first and third active areas.

Or, there is provided a semiconductor device comprising: a field area having an insulating layer embedded in, for example, a semiconductor primary surface; first through third active areas each of which is surrounded by the field area; first and second FETs formed in the second active area; and an electric circuit including the first and second FETs as a pair. The second active area is placed between the first and third active areas. In the second active area, the first FET is placed on the side of the first active area and the second FET is placed on the side of the third active area. The distance between the first and second active areas is set equal within the extent of error to the distance between the second and third active areas.

A method for manufacturing the aforementioned semiconductor device comprises: a step for forming a field area having a semiconductor insulating layer on a semiconductor substrate and forming at least first through fifth active areas which are arranged adjacently via the field area; a step for forming a first FET in part of the first active area on the side of the second active area and forming a second FET in part of the first active area on the side of the third active area; and a step for forming a circuit including the first and second FETs which outputs an output signal based on an input signal. In the method, the difference between the distance between the first and second active areas and that between the first and third active areas is set smaller than the difference between the distance between the first and second active areas and that between the fourth and fifth active areas.

Regarding the placement of the first and second transistors in the second active, it is desirable that the distance from an edge of the second active (to a transistor) on the side of the first active be equalized with that on the side of the third active.

Another semiconductor device comprises: a semiconductor substrate; a field area on the semiconductor substrate having a semiconductor insulating layer; a plurality of active areas adjacent to the field area; a first active area including a first FET and a second FET forming a circuit for outputting an output signal based on an input signal; a second active area adjacent to the first active area across a field area on the side of the first FET; a third active area adjacent to the first active area across a field area on the side of the second FET; a third FET formed in an active area of a memory cell which is formed on the semiconductor substrate; and a fourth FET placed adjacent to the third FET. In the semiconductor device, the difference between threshold voltages of the first and second FETs is set smaller than the difference between threshold voltages of the third and fourth FETs.

By the above composition, the stress on the channel of the first FET can be equalized with that on the channel of the second FET, thereby a high-reliability semiconductor device having no stress-caused characteristics imbalance can be obtained.

Further, the effects of the present invention can be obtained by making slight modification of circuit layout. Therefore, semiconductor devices with high reliability can be obtained at low manufacturing costs.

(2) A semiconductor device comprises: a semiconductor substrate; a field area on the semiconductor substrate having a semiconductor insulating layer; a plurality of active areas adjacent to the field area; a second active area adjacent to a first field area across the first field area; a third active in which a plurality of unit circuits are placed (the unit circuit including a first FET and a second FET and outputting an output signal based on an input signal); a fourth active area adjacent to the third active area across a field area on the side of the first FETs; and a fifth active area adjacent to the third active area across a field area on the side of the second FETs. In the semiconductor device, the distance between the third and fourth active areas or that between the third and fifth active areas is set longer than that between the first and second active areas.

Or, there is provided a semiconductor device comprising: a field area having an insulating layer embedded in a semiconductor primary surface; first through fifth active areas each of which is surrounded by the field area; first and second FETs formed in the third active area; and an electric circuit including the first and second FETs as a pair. The third active area is placed between the fourth and fifth active areas. In the third active area, the first FET is placed on the side of the fourth active area and the second FET is placed on the side of the fifth active area. The distance between the third and fourth active areas or the distance between the third and fifth active areas is set wider than the distance between the first and second active areas.

Regarding the placement of the first and second transistors in the third active, it is desirable that the distance from an edge of the third active (to a transistor) on the side of the fourth active be equalized with that on the side of the fifth active.

By the above composition, the stress itself can be reduced in the third active area, thereby a high-reliability semiconductor device having no characteristics imbalance caused by stress on the first and second FETs in the third active area can be obtained.

Further, the effects of the present invention can be obtained by making slight modification of circuit layout. Therefore, semiconductor devices with high reliability can be obtained at low manufacturing costs.

The first and second active can be employed for forming a memory cell section or a 2-NAND circuit section of a semiconductor device.

(3) A semiconductor device comprises: a semiconductor substrate; a field area on the semiconductor substrate having a semiconductor insulating layer; a plurality of active areas surrounded by the field area; a first FET and a second FET forming an electrically connected circuit having a function for outputting an output signal based on an input signal; a first active area in which the first FET is formed; a second active area in which the second FET is formed; a third active area adjacently located on a first side of the first active area across the field area; a fourth active area adjacently located on a second side of the first active area opposite to the first side across the field area; a fifth active area adjacently located on the first side of the second active area across the field area; a sixth active area adjacently located on the second side of the second active area opposite to the first side across the field area. In the semiconductor device, the difference between the distance between the first and third active areas and that between the second and fifth active areas or the difference between the distance between the first and fourth active areas and that between the second and sixth active areas is set smaller than the difference between the distance between the first and third active areas and that between the first and fourth active areas or the difference between the distance between the second and fifth active areas and that between the second and sixth active areas.

A method for manufacturing the above semiconductor device comprises: a step for forming a field area having a semiconductor insulating layer on a semiconductor substrate and forming at least first through fifth active areas which are arranged adjacently via the field area, in which the third active area adjacently located on a first side of the first active area across the field area, the fourth active area adjacently located on a second side of the first active area (opposite to the first side) across the field area, the fifth active area adjacently located on the first side of the second active area across the field area, and the sixth active area adjacently located on the second side of the second active area (opposite to the first side) across the field area are formed; and a step for forming a first FET in the first active area and forming a second FET in the second active area.

Or, there is provided a semiconductor device comprising: a field area having an insulating layer embedded in a semiconductor primary surface; first through sixth active areas each of which is surrounded by the field area; first and second FETs formed in the first and second active areas respectively; and an electric circuit including the first and second FETs as a pair. The first active area is placed between the third and fourth active areas, and the second active area is placed between the fifth and sixth active areas. The distance between the first and third active areas is set equal within the extent of error to the distance between the second and fifth active areas, or the distance between the first and fourth active areas is set equal within the extent of error to the distance between the second and sixth active areas.

By the above composition, the stress on the channel can be equalized between the first and second FETs which are formed in the first and second active areas respectively, thereby a high-reliability semiconductor device having no characteristics imbalance between the first and second FETs can be obtained.

Incidentally, as the electric circuit in the above semiconductor devices (1) through (3), a sense amplifier circuit, a differential amplifier circuit, a current mirror circuit, a switched capacitor circuit or a constant current/voltage circuit can preferably be employed, for example.

Further, relative to the first FET, the second FET can be placed, for example, in the direction of a line connecting the first FET and the third active area or the fourth active area.

(4) A semiconductor device comprises: a semiconductor substrate; a field area on the semiconductor substrate having a semiconductor insulating layer; a plurality of active areas surrounded by the field area; a first FET and a second FET forming an electrically connected circuit having a first function; a first active area in which the first FET is formed; a second active area in which the second FET is formed; a third active area adjacently located on a first side of the first active area across the field area; a fourth active area adjacently located on a second side of the first active area opposite to the first side across the field area; a fifth active area adjacently located on the first side of the second active area across the field area; a sixth active area adjacently located on the second side of the second active area opposite to the first side across the field area; a seventh active area; and an eighth active area adjacent to the seventh active area across the field area. In the semiconductor device, the difference between the distance between the first and third active areas and that between the first and fourth active areas or the difference between the distance between the second and fifth active areas and that between the second and sixth active areas is set smaller than the difference between the distance between the first and third active areas and that between the seventh and eighth active areas.

A method for manufacturing the semiconductor device comprises a step for forming a field area having a semiconductor insulating layer on a semiconductor substrate and forming at least first through fifth active areas which are arranged adjacently via the field area, in which the third active area adjacently located on a first side of the first active area across the field area, the fourth active area adjacently located on a second side of the first active area (opposite to the first side) across the field area, the fifth active area adjacently located on the first side of the second active area across the field area, the sixth active area adjacently located on the second side of the second active area (opposite to the first side) across the field area, the seventh active area, and the eighth active area adjacent to the seventh active area across the field area are formed; a step for forming the first FET in the first active area and forming the second FET in the second active area; and a step for forming the circuit including the first and second FETs which outputs an output signal based on an input signal.

(5) A semiconductor device comprises: a semiconductor substrate; a memory cell section on the semiconductor substrate; and a sense amplifier section on the semiconductor substrate which is electrically connected with the memory cell section via bit lines. Each of the memory cell section and the sense amplifier section includes a field area having a semiconductor insulating layer and a plurality of active areas surrounded by the field area each of which including a plurality of FETs arranged therein. The distance between the edge of the first active area and an FET in the active area nearest to the edge is set to three times or more of the distance between a first FET in the first active area and a second FET in the first active area nearest to the first FET.

Or, there is provided a semiconductor device comprising: memory cells which are formed on a semiconductor primary surface and arranged in an array; and a sense amplifier circuit which is connected with the memory cells via bit lines. FETs that form the sense amplifier circuit are repeatedly formed corresponding to the bit lines and arranged in a line in an active which is surrounded by a field area having an insulating layer embedded in the semiconductor primary surface. The distance between the outermost gate (of the FET located outermost in the FET sequence in the active) and the active's edge (located ahead of the FET sequence and on the side of the outermost gate) is set to three times or more of the periodic interval of the FETs.

The above "edge" of the active area can mean, for example, an area corresponding to a short side of the active area.

The distance between the first FET in the first active area and the second FET in the first active area nearest to the first FET can be set based on, for example, the distance between the gates. It is also possible to use an edge of a source/drain area for comparison.

The distance between the edge of the first active area and the FET nearest to the edge may also be set to three times or more of the distance between a first bit line located in the first active area and a second bit line that is the nearest to the first bit line among the bit lines arranged in the same direction as the first bit line.

The distance may also be set to three times or more of the distance between a first unit cell of the memory cell section and a second unit cell adjacent to the first unit cell.

As another embodiment, it is also possible to provide a semiconductor device comprising: a semiconductor substrate; a field area on the semiconductor substrate having a semiconductor insulating layer; a plurality of active areas surrounded by the field area; a first active area in which a first n-type FET and a second n-type FET are formed; a second active area in which a first p-type FET and a second p-type FET are formed; a circuit including the first and second n-type FETs and the first and second p-type FETs (the circuit at least having: an input section for receiving two signals with the first n-type FET and the first p-type FET; and output section for outputting an output signal based on the input signals); a third active area which is formed adjacent to the first active area across a field area on the side of the first n-type FET; a fourth active area which is formed adjacent to the first active area across a field area on the side of the second n-type FET; a fifth active area which is formed adjacent to the second active area across a field area on the side of the first p-type FET; and a sixth active area which is formed adjacent to the second active area across a field area on the side of the second p-type FET. In the semiconductor device, the difference between the distance between the first and third active areas and that between the first and fourth active areas or the difference between the distance between the second and fifth active areas and that between the second and sixth active areas is set smaller than the difference between the distance between the first and third active areas and that between the second and fifth active areas.

In the above semiconductor device, a unit circuit is formed by the n-type and p-type transistors, and a plurality of such unit circuits are arranged.

It is preferable that the above semiconductor devices of (1) through (5) be applied to semiconductor devices in which the minimum processing dimension of the gate is 0.25 µm or less.

Incidentally, the expression "equal within the extent of error" which has been used in the above description means equality within the extent of ordinary processing error (ordinary error or dispersion in processing) or preferably, within 0.05 µm. It is more desirable that the equality be within a processing error of the gate length Lg in other circuits (memory cells or 2-NAND circuits, for example) on the semiconductor circuit board on which the semiconductor device of the embodiment is formed (within 0.05 µm or more preferably, within 0.03 µm).

The above semiconductor devices can employ the following composition, for example.

The first and second FETs are two FETs of the same type (p-type or n-type), and one of the two signals from the memory cell section is inputted to the first FET through a path and the other is inputted to the second FET through another path.

The first and second FETs may form a circuit that receives first and second signals from a memory cell with the first and second FETs respectively and outputs an output signal based on the difference between the signals inputted to the FETs.

The first and second FETs can also form one of unit circuits forming a sense amplifier circuit which is connected with a cell group formed in a first area of a memory cell section via bit lines.

The first and second FETs can also form, for example, a circuit having a function for receiving signals, comparing the input signals with a prescribed value and outputting a signal based on the comparison. It is also possible to let the circuit form a so-called unit circuit and arrange a plurality of same unit circuits. The circuits can be a sense amplifier circuit section, for example.

The unit circuit can be a first sense amplifier circuit in a plurality of sense amplifier circuits forming a sense amplifier circuit section which is connected with a cell group of a first memory cell area via bit lines. For example, the unit circuit includes a first FET to which a first signal from a first memory cell area is supplied and a second FET to which a second signal corresponding to the first signal from an area corresponding to the first area is supplied, and outputs an output signal based on the difference between the signals inputted to the first and second FETs. The output signal can be an amplified signal based on the difference. Judgment on the signal difference can also be made based on a threshold value.

The shallow trench isolation is formed by cutting a shallow trench on the Si substrate and filling the trench with silicon oxide. The shallow trench isolation is known as a source of stress. The stress grows in an active adjacent to the shallow trench isolation in an oxidation process after the formation of the shallow trench on the Si substrate. The present inventors made it clear by means of stress analysis that the stress occurring to the adjacent active increases rapidly as the STI trench width gets narrower than 1 µm.

FIG. 3 shows a result of stress analysis using the finite element method, regarding the dependence of the stress on an active area on the STI trench width. We found out that the stress on the active remains constant around 400 MPa when the STI trench width is wide enough (1 µm or more) but it increases sharply as the trench width gets narrower than 1 µm. When the trench width is 0.25 µm, a compressive stress of approximately 700 MPa is caused.

Meanwhile, FIG. 4 shows experimental results regarding stress dependence of threshold voltage (one of the FET characteristics) of FETs, measured by applying external force to the FETs. The external force was applied in a direction parallel to the direction of drain current passing through the channel of the transistor (CHANNEL//STRESS) and in a direction perpendicular to the direction (CHANNEL$^\perp$STRESS). The experiment made it clear that the threshold voltage changes depending on the stress in both n-channel FETs and p-channel FETs.

In conventional circuit layout, the minimum processing dimension regarding the STI trench width used to be large. Therefore, even if the width of the shallow trench isolation adjacent to each FET (required to have equal characteristics) varied, the sensitivity of the active area to the STI trench width used to be low and thereby the stress on each active area used to be almost equal. Consequently, no characteristics difference occurred between those FETs.

However, in recent years, the STI trench width has become as narrow as approximately 0.2 µm at its narrowest part, and in circuits, elements are not laid out to keep equal STI trench widths. The analysis result of FIG. 3 by the present inventors made it clear that around such processing dimension, a slight variation in the STI trench width causes a significant difference in the stress on the active area.

Therefore, if we keep on simply miniaturizing the circuit layout of a conventional FET (in which equal FET characteristics used to be obtained even if the width of the adjacent shallow trench isolation varied), the stress difference among active areas will increase, stress-caused variation or stress dependence of the threshold voltage will vary among FETs, and thereby characteristics difference can occur among the FETs.

As the electric circuit having transistors that are desired to have equal characteristics (such as the aforementioned sense amplifier circuit), there also exist a differential amplifier circuit, a current mirror circuit, a switched capacitor circuit and a constant current/voltage circuit, for example.

For example, the semiconductor device of the present invention can be or include a circuit including a plurality of FETs of n-type or p-type which receives a signal from outside the circuit with the FETs and outputs an output signal based on the input signal. The FETs receiving the signal from outside can be those for carrying out the same processes.

Specifically, the semiconductor device can include a circuit for comparing two or more input signals and thereby outputting an output signal (sense amplifier circuit, differential amplifier circuit, etc.). The circuit can be a sense amplifier circuit to which two or more signals from a memory cell section are inputted, including two or more FETs of n-type or p-type that are connected with the memory cell section via bit lines. Or, the circuit can be or include a circuit for outputting a signal whose current/voltage variation is smaller than that of the input signal (constant current circuit, constant voltage circuit, etc.). The circuit can preferably include a current mirror circuit.

By the present invention, a high-performance semiconductor device capable of displaying its semiconductor characteristics fully and effectively can be provided. Specifically, a semiconductor device including FETs formed on the primary surface of a silicon substrate, having excellent threshold voltage characteristics; a semiconductor device employing FETs that are desired to have equal characteristics, with no characteristics imbalance and with high-reliability; a semiconductor device with low manufacturing cost; etc. can be provided by the present invention.

In the FETs which are required to have equal characteristics, by equalizing their STI trench widths (the width of shallow trench isolation adjacent to FET), stress growing in the active due to the adjacent shallow trench isolation is equalized among the transistors and thereby the characteristics of the transistors can be equalized.

Other objects, features and advantages of the invention will become apparent from the following description of the embodiments of the invention taken in conjunction with the accompanying drawings.

DETAILED DESCRIPTION OF THE INVENTION

Figure 1:
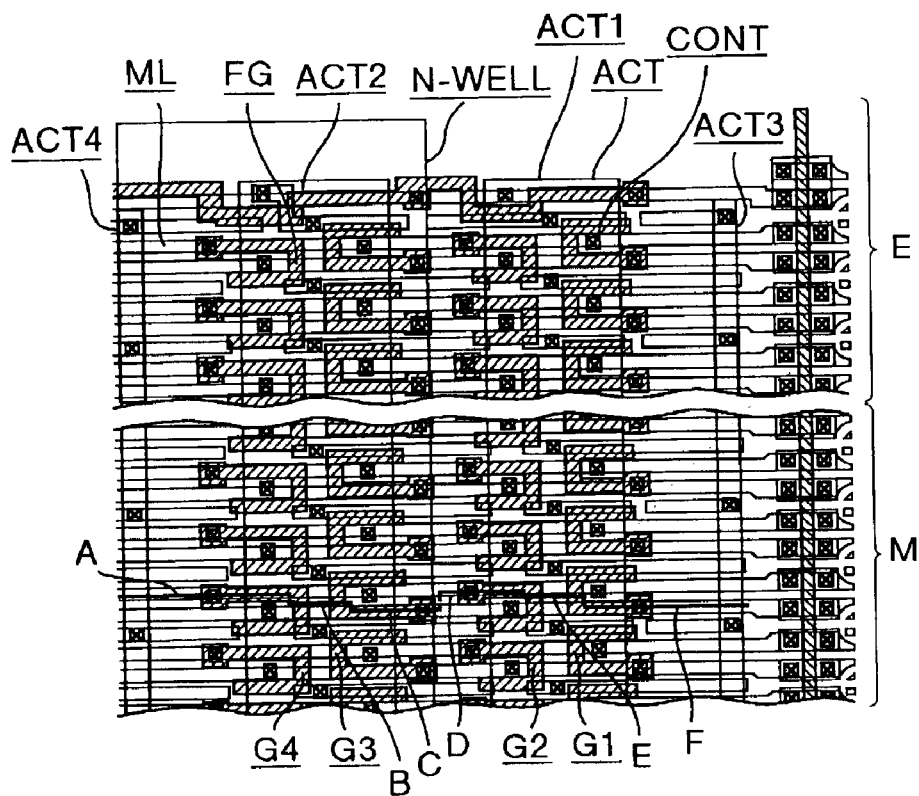
FIG. 1 is a schematic diagram showing two-dimensional layout of a semiconductor device in accordance with a first embodiment of the present invention.
Figure 2:
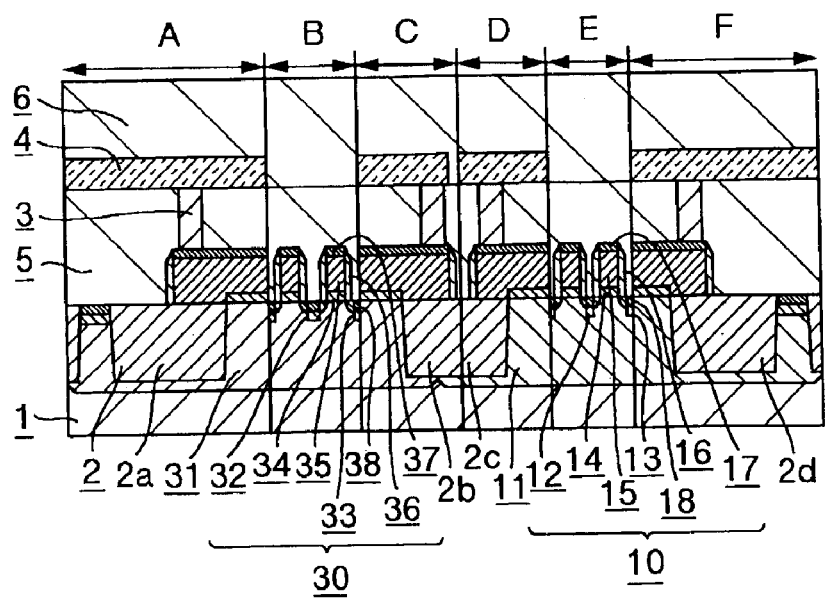
FIG. 2 is a schematic diagram showing the cross-sectional structure of the semiconductor device of the first embodiment.
Figure 3:
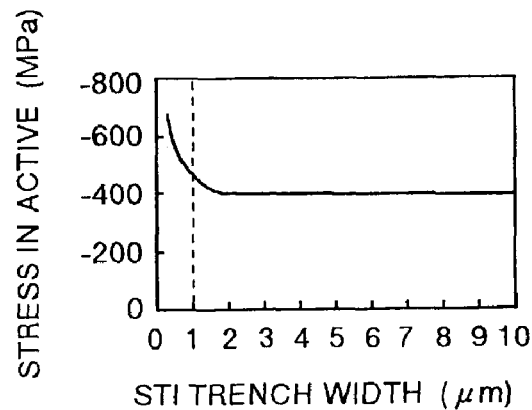
FIG. 3 is a graph showing a stress analysis result regarding the dependence of the stress on an active area on the STI trench width.
Figure 4:
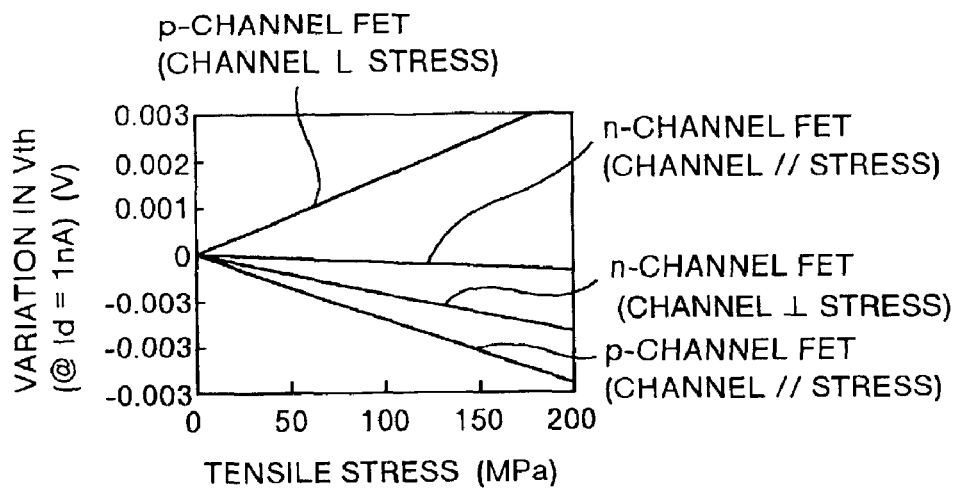
FIG. 4 is a graph showing measurement results of stress dependence of threshold voltages of an n-channel FET and a p-channel FET.
Figure 5:
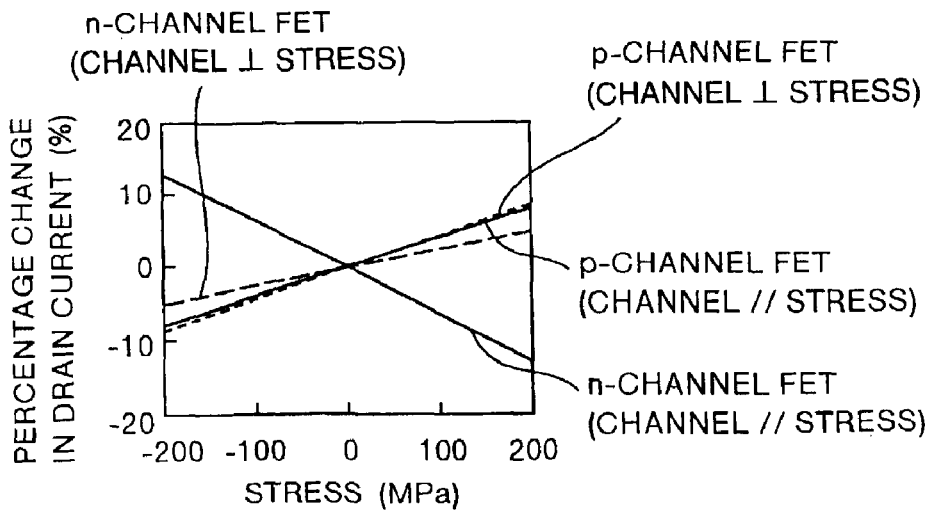
FIG. 5 is a graph showing measurement results of stress dependence of drain currents of an n-channel FET and a p-channel FET.
Figure 6:
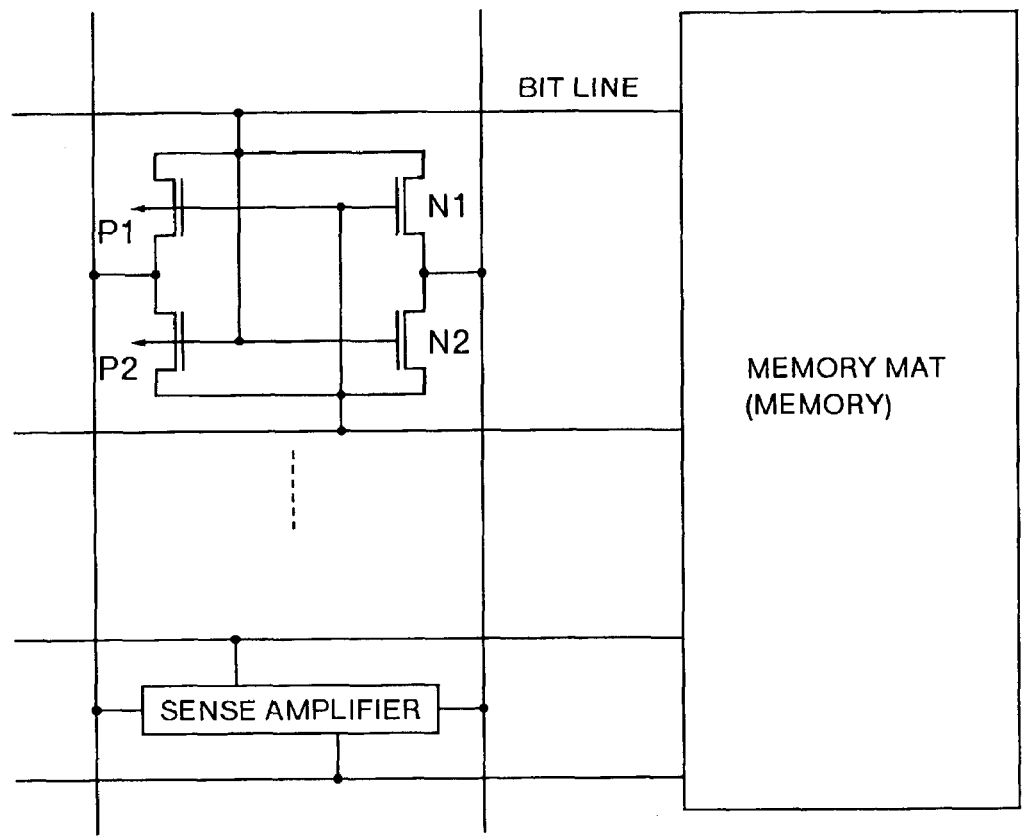
FIG. 6 is a circuit diagram of a semiconductor device in accordance with first through third embodiments of the present invention.
Figure 7:
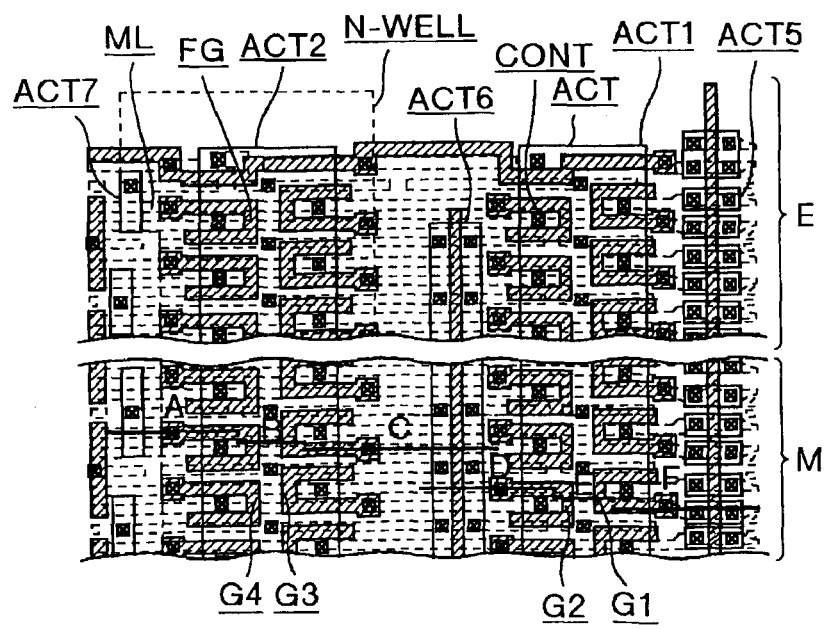
FIG. 7 is a schematic diagram showing two-dimensional layout of a semiconductor device as a comparative example relative to the first through third embodiments.
Figure 8:
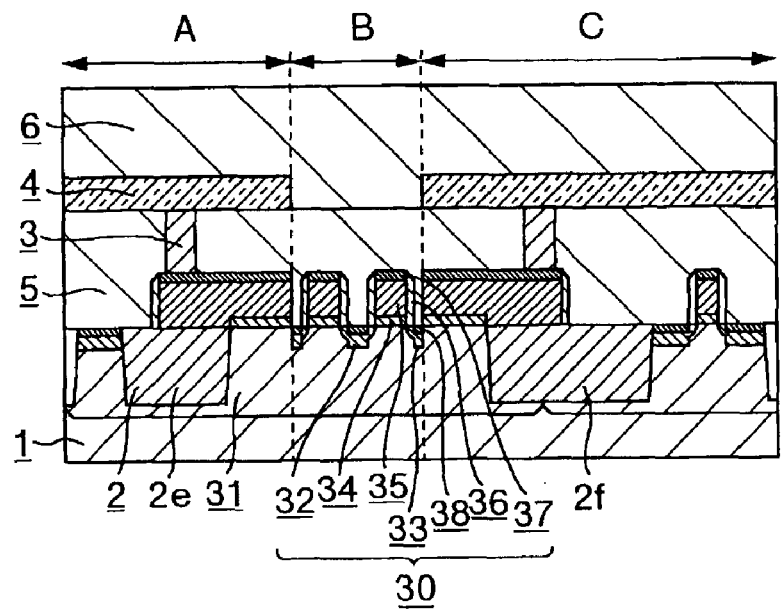
FIG. 8 is a schematic diagram showing the cross-sectional structure of the comparative example.
Figure 9:
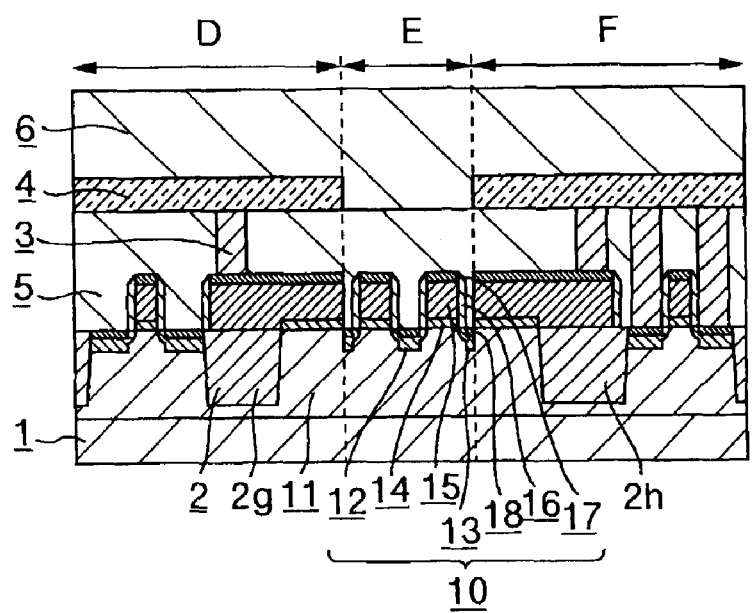
FIG. 9 is a schematic diagram showing the cross-sectional structure of the comparative example.
Figure 20:
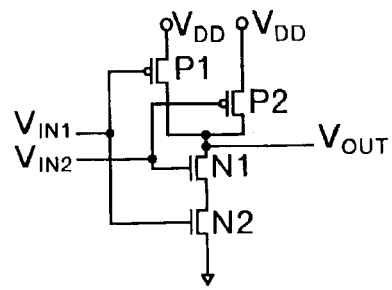
FIG. 20 is a circuit diagram for explaining "processing error" of the semiconductor device of the embodiment.
Figure 21:
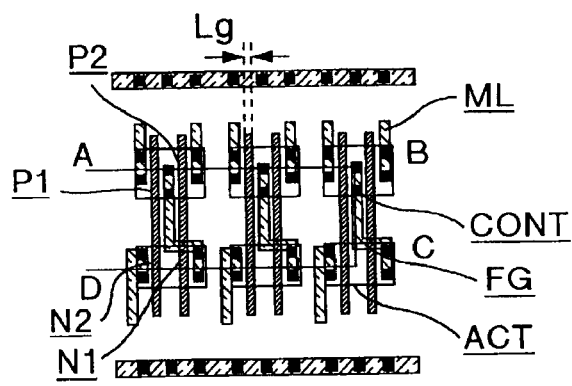
FIG. 21 is a schematic diagram showing two-dimensional layout for the explanation of the processing error.
Figure 22:
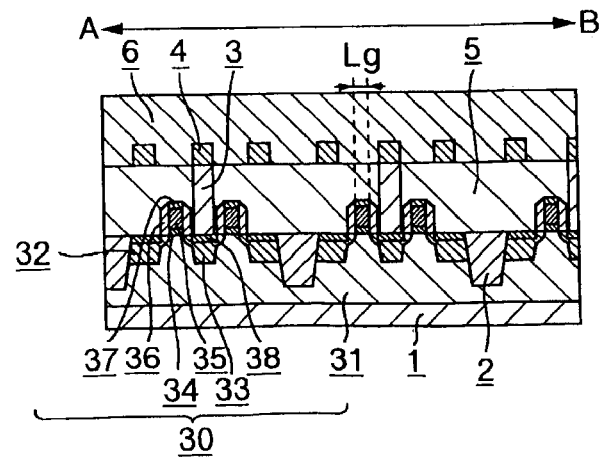
FIG. 22 is a schematic diagram showing cross-sectional structure for the explanation of the processing error.
Figure 23:
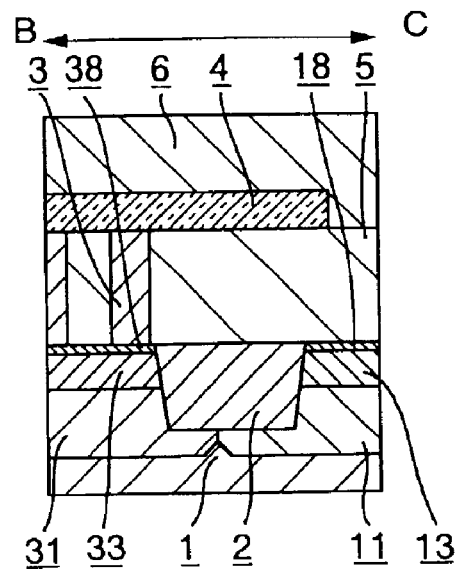
FIG. 23 is a schematic diagram showing cross-sectional structure for the explanation of the processing error.
Figure 24:
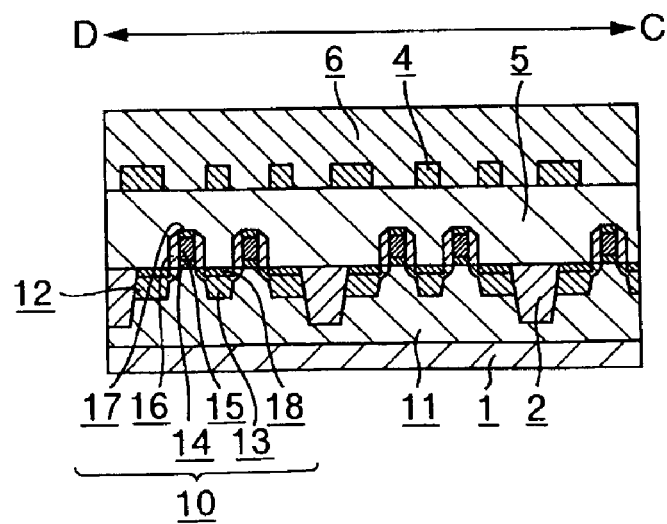
FIG. 24 is a schematic diagram showing cross-sectional structure for the explanation of the processing error.

In the following, a first embodiment in accordance with the present invention will be described referring to FIGS. 1 through 9 and FIGS. 20 through 24. FIG. 1 is a schematic diagram showing two-dimensional layout of a semiconductor device in accordance with the first embodiment of the present invention. FIG. 2 is a schematic diagram showing the cross-sectional structure of the semiconductor device of the embodiment (cross sections taken along lines A to F in FIG. 1). FIG. 3 is a graph showing a stress analysis result regarding the dependence of the stress in an active area on the STI trench width (the width of the shallow trench isolation). FIG. 4 is a graph showing measurement results of stress dependence of threshold-voltages of FETs (Field-Effect Transistors). FIG. 5 is a graph showing measurement results of stress dependence of drain currents of FETs. FIG. 6 is a circuit diagram of the semiconductor device of this embodiment. FIG. 7 is a schematic diagram showing two-dimensional layout of a semiconductor device as a comparative example. FIGS. 8 and 9 are schematic diagrams showing the cross-sectional structure of the comparative example. FIGS. 20 through 24 are drawings for explaining "processing error" of the semiconductor device of this embodiment, in which FIG. 20 is a circuit diagram, FIG. 21 is a schematic diagram showing two-dimensional layout, and FIGS. 23 through 24 are cross-sectional views taken along the lines A–B, B–C and C–D in FIG. 21.

FIG. 1 shows the two-dimensional layout of the semiconductor device of this embodiment. In FIG. 1, the composition of a representative part of the device, part of a sense amplifier circuit shown in FIG. 6, is illustrated. The group of FETs N1, N2, P1 and P2 in FIG. 6 correspond to a group of FETs that are formed by gates G1, G2, G3 and G4 in the two-dimensional layout of FIG. 1.

In the semiconductor device of this embodiment, two n-channel FETs N1 and N2 that are desired to have equal transistor characteristics are formed in an active ACT1 which is surrounded by a field area formed by the shallow trench isolation (STI) which is embedded in the primary surface of a silicon substrate. In the active ACT1, the FET N1 (gate G1) is formed on the side of an active ACT3, and the FET N2 (gate G2) is formed on the side of an active ACT2.

Similarly, two p-channel FETs P1 and P2 that are desired to have equal transistor characteristics are formed in the active ACT2, in which the FET P1 (gate G3) is formed on the side of the active ACT1 and the FET P2 (gate G4) is formed on the side of an active ACT4.

The sense amplifier circuit, which is a circuit for amplifying signals on bit lines which are connected to memory cells of a memory mat (including a plurality of memory cells arranged in an array), is formed along the memory mat. In other words, actives ACT1 and ACT2 are formed along the memory mat, and a plurality of gate groups (each of which including the gates G1–G4 (FETs N1–P2)) are placed in the actives ACT1 and ACT2 repeatedly from the middle part M to the edge part E. The FETs are connected to lines ML in an upper layer via contact plugs CONT.

FIG. 2 shows the cross-sectional structure of the semiconductor device of this embodiment (cross sections taken along lines A to G in FIG. 1). An n-channel FET 10 is composed of n-type sources/drains 12 and 13 which are formed in a p-type well 11 of the Si substrate 1, a gate insulation layer 14, a gate 15 (G1, G2), and silicide layers 17 and 18 formed on the top surfaces of the gate 15 and the sources/drains 12 and 13. A p-channel FET 30 is composed of p-type sources/drains 32 and 33 which are formed in an n-type well 31 (N-WELL) of the Si substrate 1, a gate insulation layer 34, a gate 35 (G3, G4), and silicide layers 37 and 38 formed on the top surfaces of the gate 35 and the sources/drains 32 and 33. Each transistor is insulated from other elements by the shallow trench isolation 2 containing material ($SiO_2$, SiN, etc.) having resistance higher than that of the substrate. The shallow trench isolation 2, an insulated area, can be regarded and called as a field area.

The gate insulation layer (14, 34) is formed by one or more layers having resistance higher than that of the substrate. For example, a dielectric single layer made of $SiO_2$, SiN, $TiO_2$, $ZrO_2$, $HfO_2$, $Ta_2O_5$, etc. or a multilayer composed of such dielectric layers can be employed. The gate (15, 35) is formed by, for example, a single layer made of polycrystalline silicon, a single metal layer made of W, Pt, Ru, etc., or a multilayer composed of such layers. Side walls 16 and 36 made of SiN or $SiO_2$ are provided to the flanks of the gate insulation layers 14 and 34, the gates 15 and 35, and the silicide layers 17, 18, 37 and 38. Incidentally, the structure of the FET is not limited to the above example.

The upper surfaces of the elements (n-channel FETs, p-channel FETs, etc.) are covered by interlayer insulation layers 5 and 6 each of which is made of, for example, a BPSG (Boron-doped Phospho Silicate Glass) layer, an SOG (Spin On Glass) layer, a TEOS (Tetra-Ethyl-Ortho-Silicate) layer, or a silicon oxide layer which is formed by chemical-vapor deposition (CVD) or sputtering. For electrical connection of the elements (FETs etc.), the contact plugs 3 (CONT) made of W, TiN, etc. and the lines 4 (ML) made of W, Al, TiN, etc. are used.

The key feature of the semiconductor device of this embodiment is that the distances from the active ACT1 (forming the two n-channel FETs (gates G1 and G2) which are desired to have equal transistor characteristics) to the two adjacent actives (the active ACT3 across the shallow trench isolation on the side of the gate G1 and the active ACT2 across the shallow trench isolation on the side of the gate G2) are almost equal to each other within a certain error range or tolerance. In other words, the width of the shallow trench isolation 2$d$ is almost equal to that of the shallow trench isolation 2$b$+2$c$ (within a certain error range). Similarly, with regard to the active ACT2 in which the p-channel FETs are formed, the distance from the active ACT2 to the active ACT1 (i.e. the width of the shallow trench isolation 2$b$+2$c$) is almost equal to the distance from the active ACT2 to the active ACT4 (i.e. the width of the shallow trench isolation 2$a$) within a certain error range.

In the following, the action and effect of the semiconductor device of this embodiment will be explained. In memory devices such as DRAM, information stored in each memory cell is read out by a sense amplifier by amplifying a voltage signal on a bit line that is connected to the memory cell. Since the change of voltage on the bit line to be amplified by the sense amplifier circuit (FIG. 6) is extremely small, the n-channel FETs N1 and N2 are desired to have equal characteristics, and for the same reason, the p-channel FETs P1 and P2 are also desired to have equal characteristics.

FIG. 7 shows circuit layout of another sense amplifier circuit as a comparative example, and FIGS. 8 and 9 shows the cross-sectional structure of the sense amplifier circuit of FIG. 7. The gates G1 and G2, forming the n-channel FETs N1 and N2 in the electric circuit of FIG. 6, are formed to face each other on the same active ACT1. As the sense amplifier circuit has to deal with a plurality of bit lines from the memory mat (including a plurality of memory cells arranged in an array), a plurality of gate pairs (each of which including the gates G1 and G2 as a basic unit) are arranged in the longitudinal direction of the active ACT1 which is formed along the memory mat. Similarly, with regard to the p-channel FETs, a plurality of gate pairs (each of which including the gates G3 and G4 as a basic unit) are arranged in the longitudinal direction of the active ACT2.

In the circuit layout of the comparative example, the active ACT1 for the n-channel FETs, which is formed between actives ACT5 and ACT6 for elements of other types, used to have different STI trench widths on its both sides (shallow trench isolation 2h on the side of the gate G1 and shallow trench isolation 2g on the side of the gate G2). In other words, the distance between the actives ACT1 and ACT5 used to be different from that between the actives ACT1 and ACT6.

Similarly, with regard to the active ACT2 for the p-channel FETs, the distance between the actives ACT2 and ACT6 (shallow trench isolation 2f) used to be different from that between the actives ACT2 and ACT7 (shallow trench isolation 2e).

The present inventors made it clear that such asymmetry between the STI trench widths on both sides of the active forming transistors (i.e. the asymmetry between the distances to adjacent actives) causes inequality of characteristics between the two transistors which are required equal characteristics.

FIG. 4 shows measurement results of stress dependence of threshold voltages of FETs, measured by applying external force to the FETs. As shown in FIG. 4, it became clear that the threshold voltage changes depending on the stress in both n-channel FETs and p-channel FETs.

Further, as shown in FIG. 5, it became evident that the drain current, a principal FET characteristic, also changes depending on the stress in both n-channel FETs and p-channel FETs.

By the way, the shallow trench isolation for the isolation of elements (transistors etc.) is formed by cutting a trench on the Si substrate and filling the trench with silicon oxide, silicon nitride, etc. In an oxidation process for the formation of the elements, a new oxidative reaction occurs at the interface between silicon and silicon oxide, causing expansion of volume. The volume expansion causes high compressive stress growing in adjacent actives. The STI trench width is becoming narrower and narrower with the progress of miniaturization and high integration of the elements. The present inventors found out by stress analysis that the compressive stress growing in an active gets higher as the STI trench width gets narrower. FIG. 3 shows a stress analysis result regarding the dependence of the stress in an active area on the STI trench width. The stress on the active area remains constant independently of the trench width while the STI trench width is wide, but the compressive stress exhibits trench width dependence and increases rapidly as the trench width gets narrower than 1 μm.

To sum up, it has become clear that in a semiconductor device whose STI trench widths are 1 μm or less, a change in the width of the adjacent shallow trench isolation causes a change in the stress growing in the active, and thereby causes a difference in the threshold voltage.

In conventional semiconductor devices, an active including n-channel FETs used to have a difference between the STI trench widths on its both sides (on the side of the gate G1 and on the side of the gate G2), causing a difference between the stress on a channel under the gate G1 (where the drain current passes) and that on a channel under the gate G2, resulting in a difference in the threshold voltage between the two n-channel FETs. The mechanism also applies to p-channel FETs.

In the semiconductor device in accordance with the first embodiment of the present invention, for an active ACT1 in which FETs N1 and N2 that are desired to have equal characteristics are formed, the distance between the active ACT1 and the active ACT3 on the side of the FET N1 (i.e. the width of the shallow trench isolation 2d) is set equal to that between the active ACT1 and the active ACT2 on the side of the FET N2 (i.e. the width of the shallow trench isolation 2b+2c), that is, the STI trench widths on both sides of the active ACT1 are set equal. By such composition, the stress growing in the active ACT1 become symmetrical (between the gate G1 side and the gate G2 side). As a result, even if the threshold voltages of the transistors N1 and N2 changed due to stress, the changes remain equal to each other and the two transistors keep on exhibiting equal characteristics. The same applies to actives including p-channel FETs.

The equality of characteristics that is obtained by the semiconductor device of this embodiment is not limited to the equality of threshold voltage. As shown in FIG. 5, the drain current is also affected by the stress. Any FET characteristic that is affected by the stress (drain current, mutual conductance, etc.) can be equalized between the paired transistors.

Further, the semiconductor device of this embodiment can be constructed and implemented only by making slight modifications to circuit layout of a conventional semiconductor device. Therefore, semiconductor devices with high reliability can be obtained at low manufacturing costs.

In this embodiment, the stress growing in the active ACT1 becomes symmetrical between the gate G1 side and the gate G2 side thanks to the equal STI trench widths on both sides of the active ACT1 (on the gate G1 side and the gate G2 side). The stress growing in the active due to the shallow trench isolation also has a dependence on the distance from the shallow trench isolation. Therefore, it is preferable that the distance between the shallow trench isolation 2d and the gate G1 be set equal to that between the shallow trench isolation 2b+2c and the gate G2.

Incidentally, the term "equal" in the above expressions "equal STI trench widths", "equal distances between actives", etc. regarding the semiconductor device of this embodiment means equality within the extent of an ordinary error, tolerance or dispersion in processing (hereafter referred to as "processing error") or preferably, equality within 0.05 μm. It is more desirable that the equality be within the processing error of the gate length Lg in other circuits (memory cells or 2-NAND circuits, for example) on the semiconductor circuit board on which the semiconductor device of the embodiment is formed (within 0.05 μm or more preferably, within 0.03 μm) Here, the "gate length Lg" means, for example, the width Lg of the gate FG (35, 15) in a 2-NAND circuit which is shown in FIGS. 20–24 (FIG. 20: circuit diagram, FIG. 21: two-dimensional layout, FIGS. 22–24: cross-sectional structure taken along the lines A–B, B–C and C–D in FIG. 21).

From another point of view comparing the gates G1 and G2 (or comparing the gates G3 and G4) of the sense amplifier circuit, it is also possible to set the difference between the two distances between the active including the gates and adjacent actives be set smaller than the difference between a first distance (between the active including the gates (G1/G2 or G3/G4) and an adjacent active) and a second distance (between an active in the memory array section and another active adjacent to the active across a field), although not shown in figures.

Figure 10:
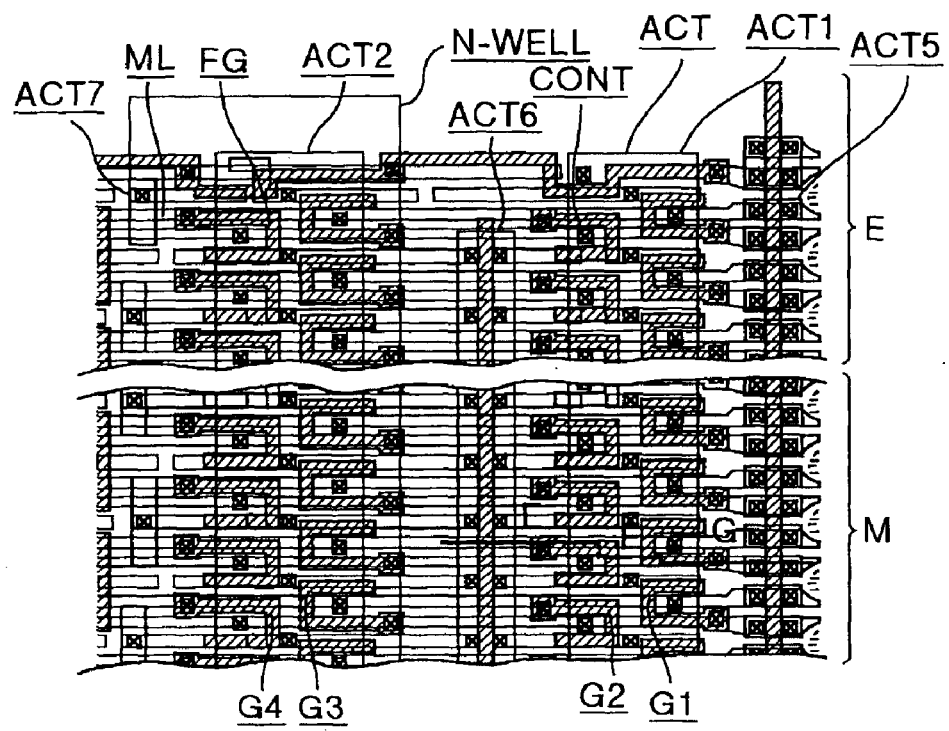
FIG. 10 is a schematic diagram showing two-dimensional layout of a semiconductor device in accordance with a second embodiment of the present invention.
Figure 11:
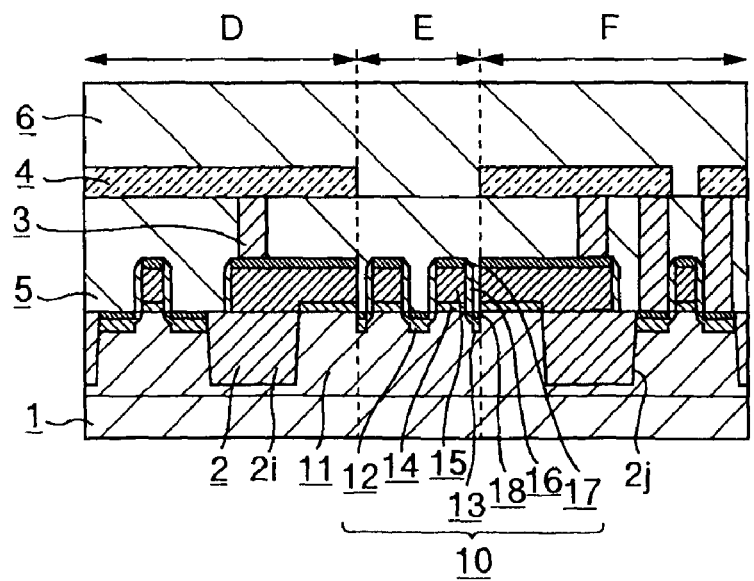
FIG. 11 is a schematic diagram showing the cross-sectional structure of the semiconductor device of the second embodiment.

In the following, a second embodiment in accordance with the present invention will be described referring to FIGS. 3 through 11. FIG. 3 is a graph showing a stress analysis result regarding the dependence of the stress in an active area on the STI trench width. FIG. 4 is a graph showing measurement results of stress dependence of threshold voltages of FETs. FIG. 5 is a graph showing measurement results of stress dependence of drain currents of FETs. FIG. 6 is a circuit diagram of the semiconductor device of this embodiment. FIG. 7 is a schematic diagram showing two-dimensional layout of a semiconductor device as a comparative example. FIGS. 8 and 9 are schematic diagrams showing the cross-sectional structure of the comparative example. FIG. 10 is a schematic diagram showing two-dimensional layout of the semiconductor device of this embodiment. FIG. 11 is a cross-sectional view of the semiconductor device of this embodiment (taken along the lines E, F and G in FIG. 10).

The difference from the first embodiment is that the distance between the actives ACT1 and ACT5 (i.e. the width of the shallow trench isolation 2*j*) and the distance between the actives ACT1 and ACT6 (i.e. the width of the shallow trench isolation 2*i*) are increased compared to conventional distances (i.e. the widths of the shallow trench isolation 2*h* and 2*g* shown in FIG. 9).

As mentioned in the first embodiment, high compressive stress grows in each active due to adjacent shallow trench isolation. As has been shown in FIG. 3, the stress caused by the shallow trench isolation has significant dependence on the trench width. The dependence is high (gradient of the tangent to the graph is large) while the trench width is narrow, but gets lower as the trench width gets wider. Especially when the trench width is 1 μm or more, the stress becomes almost constant.

By the semiconductor device in accordance with the second embodiment of the present invention, even when the widths of STI trenches adjacent to the active ACT1 are not equal to each other, the stress difference between the channels of the FETs N1 and N2 (gates G1 and G2) can be reduced by widening the trench widths. Consequently, variations in characteristics that are caused by stress can be reduced and thereby the characteristics difference between the transistors N1 and N2 can be reduced.

Further, the second embodiment is especially effective when there is discontinuity in an active (as in the first embodiment in which the active ACT5 is discontinuous relative to the active ACT1). Concretely, even if the distance between the actives ACT1 and ACT5 can be set equal to that between the actives ACT1 and ACT6, the STI trench widths on both sides of the active ACT1 is necessitated to be asymmetric at the discontinuity of the active ACT5*s* (where the active ACT5 is broken or disconnected). As a result, the stress in the active ACT1 in its longitudinal direction tends to have certain variation or distribution on the side of the active ACT5, by which the characteristics of the repeatedly formed gate pairs (each of which including the gates G1 and G2) might vary in the longitudinal direction of the active ACT1. By the second embodiment, the stress difference/variation in the longitudinal direction of the active ACT1 can be reduced even in such layout, by lowering the stress itself, thereby the difference/variation of characteristics in the longitudinal direction of the active ACT1 can be reduced.

Further, since the stress is reduced in the semiconductor device of this embodiment by widening the STI trench width, poor mechanical reliability or stability that is caused by stress (e.g. crystal defect on the active surface) can also be avoided.

In n-channel FETs, the drain current is decreased by compressive stress as shown in FIG. 8. Therefore, by widening the STI trench widths on both sides of the n-channel FETs and decreasing the compressive stress as in the second embodiment, the drain currents of the n-channel FETs can be increased and their transistor characteristics can be improved.

Further, similarly to the first embodiment, the semiconductor device of the second embodiment can be constructed only by making slight modifications to circuit layout of a conventional semiconductor device, therefore, semiconductor devices with high reliability can be obtained at low manufacturing costs.

Figure 12:
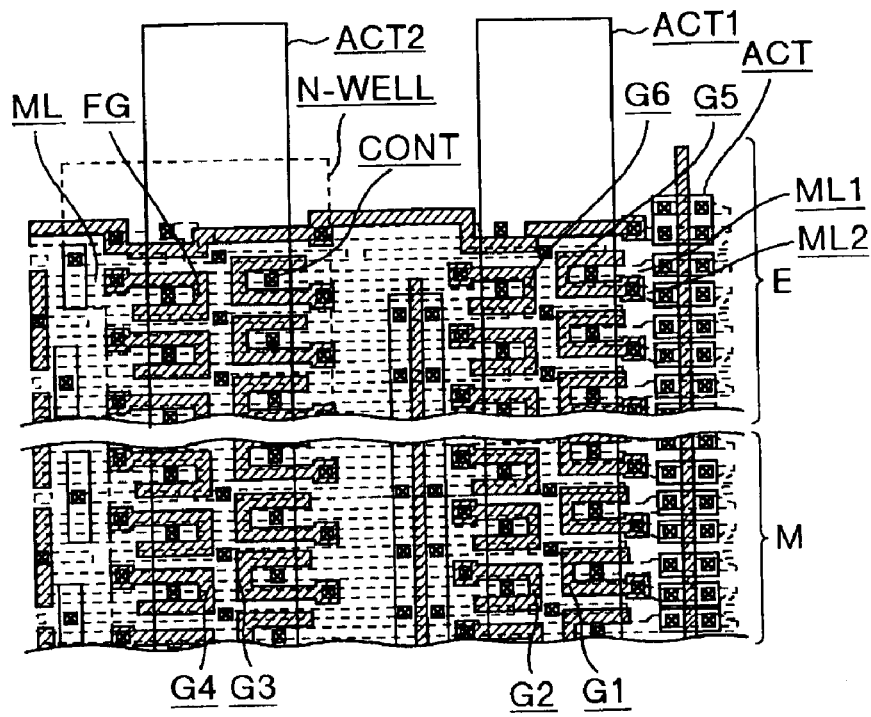
FIG. 12 is a schematic diagram showing two-dimensional layout of a semiconductor device in accordance with a third embodiment of the present invention.

In the following, a third embodiment in accordance with the present invention will be described referring to FIGS. 6 and 12. FIG. 6 is a circuit diagram of the semiconductor device of this embodiment. FIG. 12 is a schematic diagram showing two-dimensional layout of the semiconductor device of this embodiment.

The difference from the first embodiment is that in the active ACT1 in which the paired FETs N1 and N2 are repeatedly formed, the distance between the short side of the active ACT1 and the gate G5 of the outermost gate pair (G5, G6) is set to three times or more of the periodic interval of the paired bit lines M1 and M2 (running in an upper layer across the active ACT1) or the memory cells.

In the sense amplifier circuit, it is desirable that the characteristics of the paired transistors N1 and N2 (or paired transistors P1 and P2) are equal to each other as mentioned above; however, it is also important that each transistor group (including transistors N1, N2, P1 and P2) has equal characteristics since many transistor groups are formed corresponding to the memory cells.

As mentioned in the first embodiment, high compressive stress grows in each active due to adjacent shallow trench isolation. The stress occurring to the active decreases as the distance from the shallow trench isolation increases. Therefore, there exists certain stress variation or distribution in the longitudinal direction of the active ACT1 when seen from its short side. As a result, the characteristics of the transistor (formed by the gates G5 and G6) nearest to the short side of the active ACT1 might differ from those of transistors (formed by the gates G1 and G2) far from the short side. The stress caused by the shallow trench isolation is reduced to a constant as it gets farther from the shallow trench isolation. Therefore, by widening the part of the active along its short side (that is, by stretching the active in its longitudinal direction), the difference between the stress on the channel of the transistor in the edge part E and that on the channel of a transistor in the middle part M can be reduced.

By the semiconductor device in accordance with the third embodiment of the present invention, the variation or distribution of the channel stress (stress on the channel of each of the FETs which are repeatedly formed corresponding to the memory cells) in the direction of the repetition can be reduced, by which characteristics difference among the sense amplifiers can be eliminated.

Further, a free area to be used for widening the active (ACT1, ACT2) is in many cases found easily around the short side of the active, therefore, sense amplifiers with superior characteristics can be obtained without affecting the layout of other elements.

Figure 13:
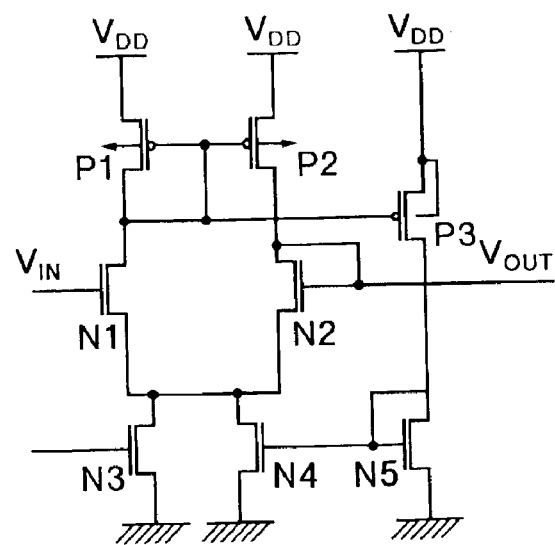
FIG. 13 is a circuit diagram of a semiconductor device in accordance with a fourth embodiment of the present invention.
Figure 14:
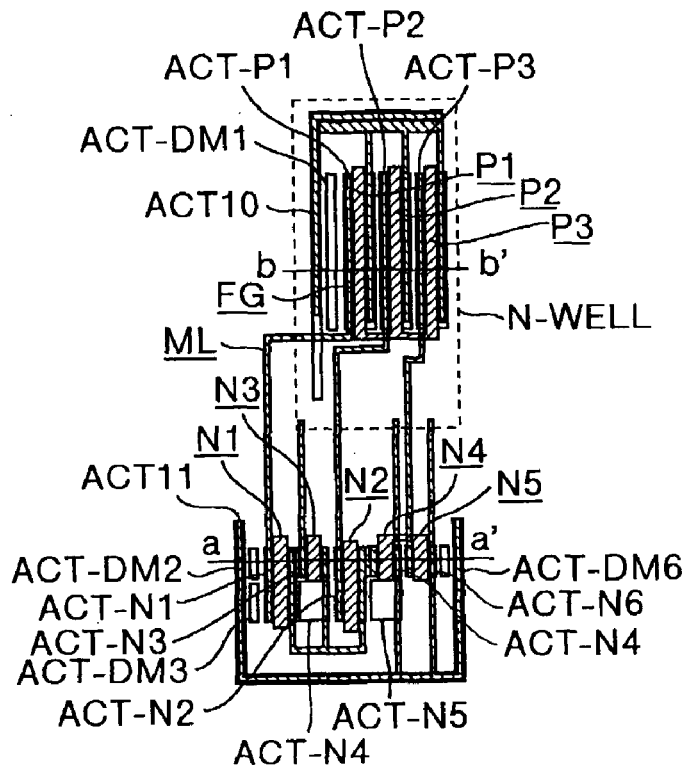
FIG. 14 is a schematic diagram showing two-dimensional layout of the semiconductor device of the fourth embodiment.
Figure 15:
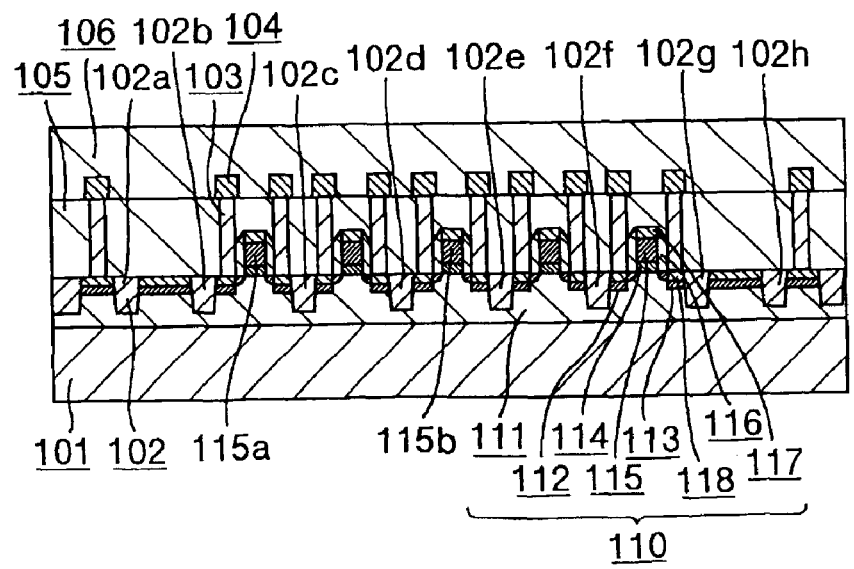
FIGS. 15 and 16 are schematic diagrams showing the cross-sectional structure of the semiconductor device of the fourth embodiment.
Figure 16:
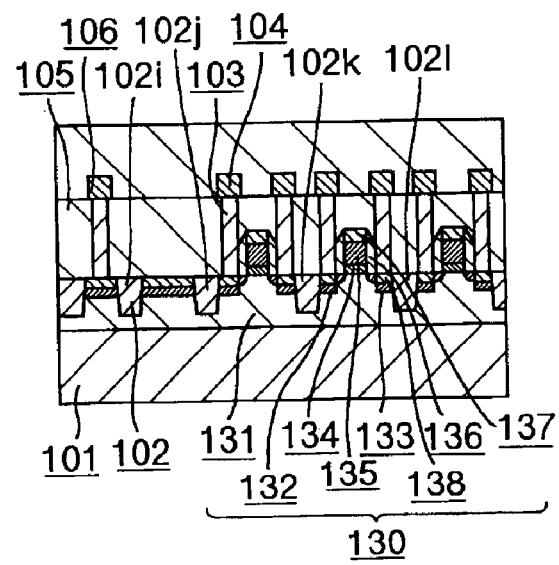
Figure 17:
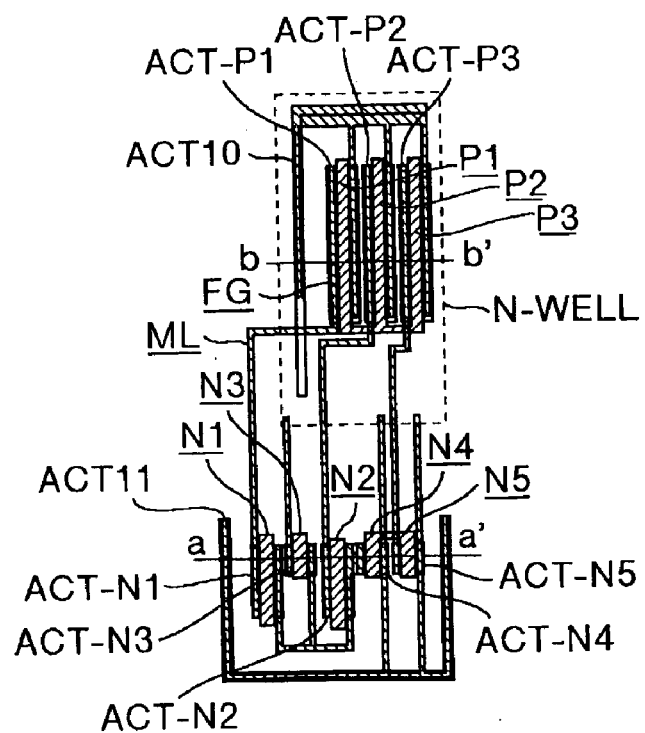
FIG. 17 is a schematic diagram showing two-dimensional layout of a semiconductor device as a comparative example relative to the fourth embodiment.
Figure 18:
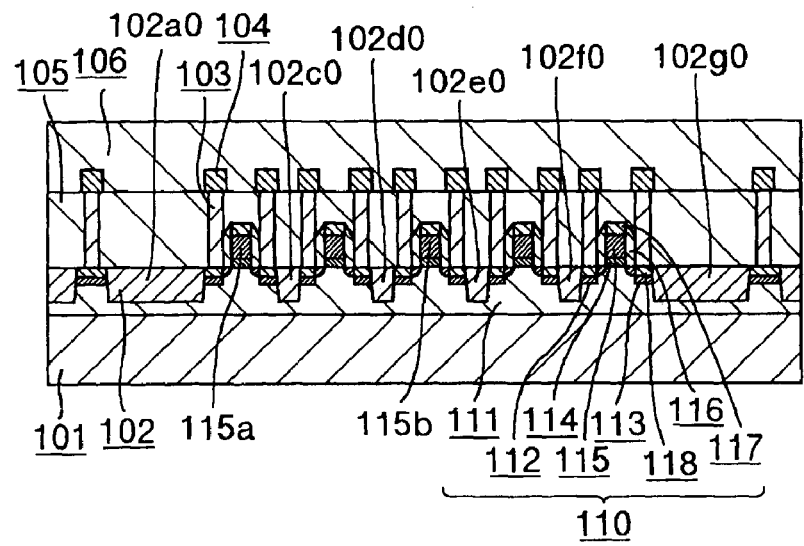
FIG. 18 is a schematic diagram showing the cross-sectional structure of the comparative example.
Figure 19:
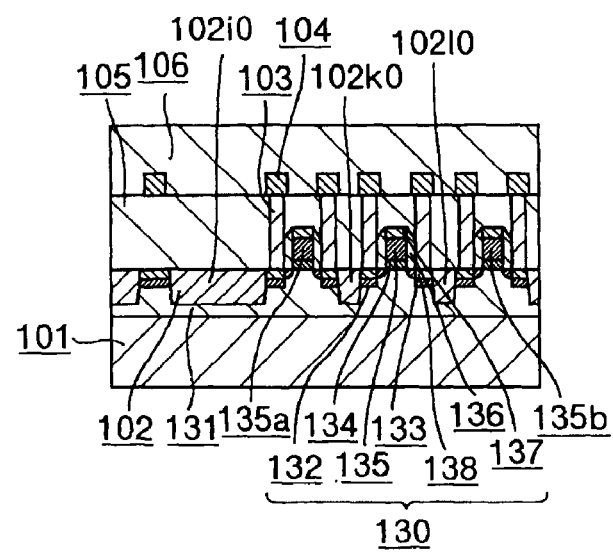
FIG. 19 is a schematic diagram showing the cross-sectional structure of the comparative example.

In the following, a fourth embodiment in accordance with the present invention will be described referring to FIGS. 13 through 19. FIG. 13 is a circuit diagram of the semiconductor device of this embodiment. FIG. 14 is a schematic diagram showing two-dimensional layout of the semiconductor device of this embodiment. FIG. 15 is a cross-sectional view of the semiconductor device of this embodiment (taken along the line a–a' in FIG. 14). FIG. 16 is a cross-sectional view of the semiconductor device of this embodiment (taken along the line b–b' in FIG. 14). FIG. 17 is a schematic diagram showing two-dimensional layout of a semiconductor device as a comparative example. FIG. 18 is a cross-sectional view of the comparative example (taken along the line a–a' in FIG. 17). FIG. 19 is a cross-sectional view of the comparative example (taken along the line b–b' in FIG. 17).

The difference from the first embodiment is that dummy actives (in which no element is formed) are provided in order to realize the equal distance between actives.

An amplifier circuit to which the present invention is applied is shown in a circuit diagram of FIG. 13. The circuit of FIG. 13 is a constant voltage circuit (for holding a constant voltage for other circuits) which receives an input voltage $V_{IN}$ at its transistor N1 and outputs a constant voltage $V_{OUT}$. Also in this circuit, it is desirable that the transistors N1 and N2 and the transistors P1 and P2 have equal characteristics respectively.

FIG. 14 schematically shows the circuit layout of the semiconductor device of this embodiment. The transistors N1–N5 and P1–P3 which have been shown in the circuit diagram of FIG. 13 correspond to the transistors N1–N5 and P1–P3 in the two-dimensional layout of FIG. 14.

The semiconductor device of the fourth embodiment is characterized by the dummy actives ACT-DM2, ACT-DM3, ACT-DM4 and ACT-DM5 which are formed for the actives ACT-N1 and ACT-N2 (forming the transistors N1 and N2 which are desired to have equal characteristics) so that the distances from the active ACT-N1 to adjacent actives across field areas (existing on both sides (source/drain sides) of the gate (of the transistor N1) which is formed on the upper surface so as to penetrate the active ACT-N1) will be equal within the ordinary processing error to the distances from the active ACT-N2 to adjacent actives across field areas on the source/drain sides.

Similarly, also for the transistors P1 and P2 being desired to have equal characteristics, the distances from the active ACT-P1 (forming the transistor P1) to adjacent actives (ACT-P2, ACT-DM1) across field areas on the source/drain sides are set equal (within the ordinary processing error) to those from the active ACT-P2 (forming the transistor P2) to adjacent actives (ACT-P1, ACT-P3) across field areas on the source/drain sides.

FIGS. 15 and 16 show the cross-sectional structure of the semiconductor device of this embodiment (taken along the lines a–a' and b–b' in FIG. 14). In the two-dimensional layout of FIG. 14, each n-channel FET (N1–N5) formed on the a–a' cross section is composed of n-type sources/drains 112 and 113 which are formed in a p-type well 111 of the Si substrate 101, a gate insulation layer 114, a gate 115, and silicide layers 117 and 118 which are formed on the top surfaces of the gate 115 and the sources/drains 112 and 113. Each element is insulated from others by the shallow trench isolation (STI) 102, in which the widths of the shallow trench isolation 102b, 102c, 102d, 102e, . . . are set equal.

Similarly, each p-channel FET (P1–P3) formed on the b–b' cross section is composed of p-type sources/drains 132 and 133 which are formed in an n-type well 131 (N-WELL) of the Si substrate 101, a gate insulation layer 134, a gate 135, and silicide layers 137 and 138 which are formed on the top surfaces of the gate 135 and the sources/drains 132 and 133. Each element is insulated from others by the shallow trench isolation (STI) 102, in which the widths of the shallow trench isolation 102j, 102k and 102l are set equal.

The upper surfaces of the transistors are covered by interlayer insulation layers 105 and 106, and a necessary circuit is formed by use of electrical connection by lines 104 and contact plugs 104. Incidentally, the elements and layers of the semiconductor device of this embodiment can be formed employing the materials and deposition method described in the first embodiment. The structure of the transistor is not limited to the above example.

In the following, the action and effect of the semiconductor device of this embodiment will be explained. As mentioned above, the amplifier circuit shown in the circuit diagram of FIG. 13 is a constant voltage circuit which receives an input voltage $V_{IN}$ at its transistor N1 and outputs a constant voltage $V_{OUT}$, in which the transistors N1 and N2 are required to have equal characteristics and ditto for the transistors P1 and P2.

As explained in the first embodiment, even two equivalent FETs (formed in the same dimensions, processing accuracy and manufacturing process) can have different threshold voltages and drain currents if their STI trench widths are different. A conventional semiconductor device to which the present invention has not been applied is shown in FIG. 17 (circuit layout), FIG. 18 (cross section taken along the line a–a' in FIG. 17) and FIG. 19 (cross section taken along the line b–b' in FIG. 17). In the conventional circuit layout, the distances from the active ACT-N1 forming a transistor N1 (having the gate 115a) to adjacent actives across field areas on its both (source/drain) sides (i.e. the widths of the shallow trench isolation 102a0 and 102c0) used to be different from the distances from the active ACT-N2 forming a transistor N2 (having the gate 115b) to adjacent actives across field areas on its both (source/drain) sides (i.e. the widths of the shallow trench isolation 102d0 and 102e0).

Similarly, the transistor P1 (having the gate 135a) and the transistor P2 (having the gate 135b) did not have the symmetry of the distances to adjacent actives (STI trench widths). Therefore, the transistors N1 and N2 (or transistors P1 and P2) might have different characteristics due to the difference in the stress caused by the shallow trench isolation.

As a method for providing the parity or equality of characteristics to the paired transistors which are required to have equal characteristics, the method of the first embodiment (equalizing the distances to adjacent actives (i.e. equalizing the STI trench widths) by altering the circuit layout) can of course be employed. However, there are cases where such circuit layout alteration is actually impossible in consideration of the relationship with other circuits.

By the semiconductor device in accordance with the fourth embodiment of the present invention, the transistors that are desired to have equal characteristics can be provided with equal STI trench widths and equal characteristics, by adding dummy actives (which are not used as electric circuits) to a conventional circuit layout. Concretely, in FIGS. 14 and 15, the transistors N1 (having the gate 115a) and the transistors N2 (having the gate 115b) which are required to have equal characteristics are given equal STI trench widths, equal stress on the active, and thereby equal characteristics. The same applies to other transistor pairs. To sum up, by the fourth embodiment only requiring the addition of the dummy actives, transistors having equal characteristics can be obtained without the need of major alterations to the circuit layout.

Incidentally, the fourth embodiment employs the dummy actives ACT-DM2 and ACT-DM3 separately as shown in FIG. 14. It is also possible to put them (ACT-DM2, ACT-DM3) together; however, the characteristics of the transistors N1 and N2 can be more equalized by the composition of FIG. 14, in which the relationship between the transistor N1 and adjacent actives (actives ACT-DM2, ACT-DM3, ACT-DM4 and ACT-N3 adjacent to the active ACT-1) is set equal to that between the transistor N2 and adjacent actives (actives ACT-DM4, ACT-DM5, ACT-N3 and ACT-N4 adjacent to the active ACTN-2).

The stress caused in the active by the shallow trench isolation changes depending on the distance from the shallow trench isolation. Therefore, it is preferable that the gate of each of the paired transistors (which are desired to have equal characteristics) be placed at the center of each active. For example, the position of the gate 115a on the active surface is set so that the distances from the shallow trench isolation 102b and 102c will be equal. By such placement of the gate 115a, the characteristics difference between the transistors N1 and N2 (gates 115a and 115b) under the condition of equal STI trench widths (of the shallow trench isolation 102b–102e) can be reduced more effectively. The same applies to the transistors P1 and P2.

Incidentally, the above amplifier circuit to which this embodiment is applied is only an example of a circuit including transistors that are desired to have equal characteristics. Therefore, the embodiment is of course applicable to other electric circuits.

The term "equal" which has been used in this embodiment means equality within the aforementioned ordinary processing error, as in the first embodiment.

As set forth hereinabove, by the present invention, a high-performance semiconductor device capable of displaying its semiconductor characteristics fully and effectively can be manufactured and provided.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A semiconductor device comprising:
 a semiconductor substrate;
 a field area on the semiconductor substrate having a semiconductor insulating layer;
 a plurality of active areas adjacent to the field area;
 a first active area including a first FET (Field-Effect Transistor) and a second FET forming a circuit for outputting an output signal based on an input signal;
 a second active area adjacent to the first active area across a field area on the side of the first FET;
 a third active area adjacent to the first active area across a field area on the side of the second FET;
 a fourth active area; and
 a fifth active area adjacent to the fourth active area across a field area, wherein:
 the difference between the distance between the first and second active areas and the distance between the first and third active areas is set smaller than the difference between the distance between the first and second active areas and the distance between the fourth and fifth active areas.

2. A semiconductor device comprising:
 a semiconductor substrate;
 a field area on the semiconductor substrate having a semiconductor insulating layer;
 a plurality of active areas adjacent to the field area;
 a first active area including a first FET and a second FET forming a circuit for receiving an input signal and outputting an output signal corresponding to the input signal;
 a second active area adjacent to the first active area across a field area on the side of the first FET; and
 a third active area adjacent to the first active area across a field area on the side of the second FET, wherein:
 the distance between the first and second active areas is set equal within the extent of error to the distance between the first and second active areas.

3. A semiconductor device comprising:
 a semiconductor substrate;
 a field area on the semiconductor substrate having a semiconductor insulating layer;
 a plurality of active areas adjacent to the field area;
 a first active area including a first FET of n-type or p-type and a second FET of the same type forming a sense amplifier circuit to which at least two signals from a memory cell section are inputted via bit lines, the first and second FETs receiving the two signals from the sense amplifier section;
 a second active area adjacent to the first active area across a field area on the side of the first FET;
 a third active area adjacent to the first active area across a field area on the side of the second FET;
 a fourth active area; and
 a fifth active area adjacent to the fourth active area across a field area, wherein:
 the difference between the distance between the first and second active areas and the distance between the first and third active areas is set smaller than the difference between the distance between the first and second active areas and the distance between the fourth and fifth active areas.

4. A semiconductor device comprising:
 a semiconductor substrate;
 a field area on the semiconductor substrate having a semiconductor insulating layer;
 a plurality of active areas adjacent to the field area;
 a second active area adjacent to a first field area across the first field area;
 a third active area in which a plurality of unit circuits are placed, the unit circuit including a first FET and a second FET and outputting an output signal based on an input signal;
 a fourth active area adjacent to the third active area across a field area on the side of the first FETs; and
 a fifth active area adjacent to the third active area across a field area on the side of the second FETs, wherein:
 the distance between the third and fourth active areas or the distance between the third and fifth active areas is set longer than the distance between the first and second active areas.

5. A semiconductor device comprising:
 a semiconductor substrate;
 a field area on the semiconductor substrate having a semiconductor insulating layer;

a plurality of active areas surrounded by the field area;

a first FET and a second FET forming an electrically connected circuit having a function for outputting an output signal depending on an input signal;

a first active area in which the first FET is formed;

a second active area in which the second FET is formed;

a third active area adjacently located on a first side of the first active area across the field area;

a fourth active area adjacently located on a second side of the first active area opposite to the first side across the field area;

a fifth active area adjacently located on the first side of the second active area across the field area;

a sixth active area adjacently located on the second side of the second active area opposite to the first side across the field area, wherein:

the difference between the distance between the first and third active areas and the distance between the second and fifth active areas or the difference between the distance between the first and fourth active areas and the distance between the second and sixth active areas is set smaller than the difference between the distance between the first and third active areas and the distance between the first and fourth active areas or the difference between the distance between the second and fifth active areas and the distance between the second and sixth active areas.

6. A semiconductor device comprising:

a semiconductor substrate;

a field area on the semiconductor substrate having a semiconductor insulating layer;

a plurality of active areas surrounded by the field area;

a first FET and a second FET forming a circuit having a first function;

a first active area in which the first FET is formed;

a second active area in which the second FET is formed;

a third active area adjacently located on a first side of the first active area across the field area;

a fourth active area adjacently located on a second side of the first active area opposite to the first side across the field area;

a fifth active area adjacently located on the first side of the second active area across the field area;

a sixth active area adjacently located on the second side of the second active area opposite to the first side across the field area;

a seventh active area; and an eighth active area adjacent to the seventh active area across the field area, wherein:

the difference between the distance between the first and third active areas and the distance between the second and fith active areas or the difference between the distance between the first and fourth active areas and the distance between the second and sixth active areas is set smaller than the difference between the distance between the first and third active areas and the distance between the seventh and eighth active areas.

7. A semiconductor device comprising:

a semiconductor substrate;

a memory cell section on the semiconductor substrate; and a sense amplifier section on the semiconductor substrate which is electrically connected with the memory cell section via bit lines, wherein:

each of the memory cell section and the sense amplifier section includes a field area having a semiconductor insulating layer and a plurality of active areas adjacent to the field area each of which including a plurality of FETs arranged therein, and the distance between the edge of the first active area and an FET in the first active area nearest to the edge is set to three times or more of the distance between a first FET in the first active area and a second FET in the first active area nearest to the first FET.

8. A semiconductor device comprising:

a semiconductor substrate;

a field area on the semiconductor substrate having a semiconductor insulating layer;

a plurality of active areas surrounded by the field area;

a first active area in which a first n-type FET and a second n-type FET are formed;

a second active area in which a first p-type FET and a second p-type FET are formed;

a circuit including the first and second n-type FETs and the first and second p-type FETs and being electrically connected with a memory cell section, the circuit at least receiving a first input signal from the memory cell section with the first and second n-type FETs, receiving a second input signal from the memory cell section with the first and second p-type FETs, and outputting an output signal based on the input signals;

a third active area which is formed adjacent to the first active area across a field area on the side of the first n-type FET;

a fourth active area which is formed adjacent to the first active area across a field area on the side of the second n-type FET;

a fifth active area which is formed adjacent to the second active area across a field area on the side of the first p-type FET; and a sixth active area which is formed adjacent to the second active area across a field area on the side of the second p-type FET, wherein:

the difference between the distance between the first and third active areas and the distance between the first and fourth active areas or the difference between the distance between the second and fifth active areas and the distance between the second and sixth active areas is set smaller than the difference between the distance between the first and third active areas and the distance between the second and fifth active areas.

9. A semiconductor device comprising:

a semiconductor substrate;

a field area on the semiconductor substrate having a semiconductor insulating layer;

a plurality of active areas adjacent to the field area;

a first active area including a first FET and a second FET forming a circuit for outputting an output signal based on an input signal;

a second active area adjacent to the first active area across a field area on the side of the first FET;

a third active area adjacent to the first active area across a field area on the side of the second FET;

a third FET formed in an active area of a memory cell which is formed on the semiconductor substrate; and a fourth FET placed adjacent to the third FET, wherein:

the difference between threshold voltages of the first and second FETs is set smaller than the difference between threshold voltages of the third and fourth FETs.

10. The semiconductor device as claimed in claim 1, wherein gate length of at least one of the FETs is 0.25 μm or less.

11. The semiconductor device as claimed in claim 1, wherein the circuit is one selected from a differential amplifier circuit, a current mirror circuit, a switched capacitor circuit and a constant current/voltage circuit.

12. A method for manufacturing a semiconductor device, comprising the steps of:

a step for forming a field area having a semiconductor insulating layer on a semiconductor substrate and forming at least first through fifth active areas which are arranged adjacently via the field area;

a step for forming a first FET in part of the first active area on the side of the second active area and forming a second FET in part of the first active area on the side of the third active area; and a step for forming a circuit including the first and second FETs which outputs an output signal based on an input signal, wherein:

the difference between the distance between the first and second active areas and the distance between the first and third active areas is set smaller than the difference between the distance between the first and second active areas and the distance between the fourth and fifth active areas.

13. A method for manufacturing a semiconductor device, comprising the steps of:

a step for forming a field area having a semiconductor insulating layer on a semiconductor substrate and forming at least first through sixth active areas which are arranged adjacently via the field area, in which the third active area adjacently located on a first side of the first active area across the field area, the fourth active area adjacently located on a second side of the first active area opposite to the first side across the field area, the fifth active area adjacently located on the first side of the second active area across the field area, and the sixth active area adjacently located on the second side of the second active area opposite to the first side across the field area are formed;

a step for forming a first FET in the first active area and forming a second FET in the second active area; and a step for forming a circuit including the first and second FETs which outputs an output signal based on an input signal, wherein:

the difference between the distance between the first and third active areas and the distance between the second and fifth active areas or the difference between the distance between the first and fourth active areas and the distance between the second and sixth active areas is set smaller than the difference between the distance between the first and third active areas and the distance between the first and fourth active areas or the difference between the distance between the second and fifth active areas and the distance between the second and sixth active areas.

14. A method for manufacturing a semiconductor device, comprising the steps of:

a step for forming a field area having a semiconductor insulating layer on a semiconductor substrate and forming at least first through eighth active areas which are arranged adjacently via the field area, in which the third active area adjacently located on a first side of the first active area across the field area, the fourth active area adjacently located on a second side of the first active area opposite to the first side across the field area, the fifth active area adjacently located on the first side of the second active area across the field area, the sixth active area adjacently located on the second side of the second active area opposite to the first side across the field area, the seventh active area, and the eighth active area adjacent to the seventh active area across the field area are formed;

a step for forming the first FET in the first active area and forming the second FET in the second active area; and a step for forming the circuit including the first and second FETs which outputs an output signal based on an input signal, wherein:

the difference between the distance between the first and third active areas and the distance between the second and fifth active areas or the difference between the distance between the first and fourth active areas and the distance between the second and sixth active areas is set smaller than the difference between the distance between the first and third active areas and the distance between the seventh and eighth active areas.

15. A method for manufacturing a semiconductor device, comprising the steps of:

a step for forming a field area having a semiconductor insulating layer on a semiconductor substrate and forming a plurality of active areas adjacent to the field area;

a step for forming a plurality of FETs in a first active areas; and a step for forming a memory cell section and forming a sense amplifier section including the first and second FETs which is electrically connected with the memory cell section via bit lines, wherein:

the distance between the edge of the first active area and an FET in the first active area nearest to the edge is set to three times or more of the distance between a first FET in the first active area and a second FET in the first active area nearest to the first FET.

* * * * *